United States Patent [19]

Smith

[11] Patent Number: 4,951,001

[45] Date of Patent: Aug. 21, 1990

[54] LIMITER AND DETECTOR CIRCUIT AND METHOD

[75] Inventor: Clyde Smith, Lake Ronkonkoma, N.Y.

[73] Assignee: Television Corporation of America, Bohemia, N.Y.

[21] Appl. No.: 405,946

[22] Filed: Sep. 12, 1989

[51] Int. Cl.$^5$ .............................................. H03K 9/06
[52] U.S. Cl. .................................... 329/343; 329/336
[58] Field of Search ............... 329/336, 337, 341, 342, 329/343; 328/140; 307/519

[56] References Cited

FOREIGN PATENT DOCUMENTS 0137308 8/1983 Japan .................................... 329/343

Primary Examiner—David Mis
Attorney, Agent, or Firm—Martin M. Novack

[57] ABSTRACT

The invention utilizes a commercially available so-called "quad-pack" of logic gates; i.e. four exclusive OR or exclusive NOR gates mounted in a package. With minimal use of additional components and minimal circuit coupling, a quad-pack of this type is used to produce a detector circuit with FM limiting and an approximate 90° phase shift. The circuit can be used for detecting an FM modulated video signal.

18 Claims, 1 Drawing Sheet

LIMITER AND DETECTOR CIRCUIT AND METHOD

BACKGROUND OF THE INVENTION

This invention relates to detection of FM modulated signals and, more particularly, to an improved circuit and method for utilizing a commercially available and relatively inexpensive logic pack, with minimal modification and additional component requirement, to produce a detector, limiter, and phase shifter.

The are various applications where it is necessary to detect a signal such as a video signal that has been used to FM modulate a carrier. For example, when an FM carrier modulated with video is transmitted over a fiber optics link, the received signal is typically recovered using a frequency or phase detection technique. It is, or course, desirable to reduce the complexity and cost of circuits utilized for this purpose, and it is among the objects of the present invention to achieve this end.

SUMMARY OF THE INVENTION

The present invention utilizes a commercially available so-called "quad-pack" of logic gates; i.e. four exclusive OR or exclusive NOR gates mounted in a package. Each gate has two input terminals and one output terminal. Representative commercial logic quad-packs are the 74HC86N or the 74AC86N exclusive OR quad-packs sold by Texas Instruments Corp. The present invention utilizes a quad-pack of this type, with minimal use of additional components and minimal circuit coupling, to produce a detector circuit with FM limiting and an approximate 90° phase shift.

In accordance with an embodiment of the method of the invention, there is disclosed a technique for converting a logic gate pack that includes four exclusive OR or exclusive NOR logic gates, each said logic gate having a pair of input terminals and an output terminal, into a circuit for limiting and detecting an FM input signal, comprising the following steps: coupling the input signal to one input terminal of a first of the logic gates; coupling the other input terminal of the first logic gate to a reference potential; coupling the output terminal of the first logic gate to said one input terminal thereof in a feedback arrangement; coupling the output terminal of the first logic gate to one input terminal of a second of the logic gates, the other input terminal of the second logic gate being coupled to a reference potential; coupling the output terminal of the second logic gate to one input terminal of a third of the logic gates, the other of the input terminals of the third logic gate being coupled to a reference potential; and coupling the output terminal of the third logic gate to one of the input terminals of a fourth of the logic gates, and coupling the other input terminal of the fourth logic gate to the output terminal of the first logic gate. The signal at the output terminal of the fourth logic gate is representative of a detected version of the FM input signal.

In one embodiment of the invention, the logic gates are exclusive OR gates, and the reference potentials are positive reference potentials. In another embodiment of the invention, the logic gates are exclusive NOR gates, and the reference potentials are negative reference potentials.

Further features and advantages will become more readily apparent from the following detailed description when taken in conjunction with the accompanying drawings.

DESCRIPTION OF THE PREFERRED EMBODIMENTS

Figure 1:
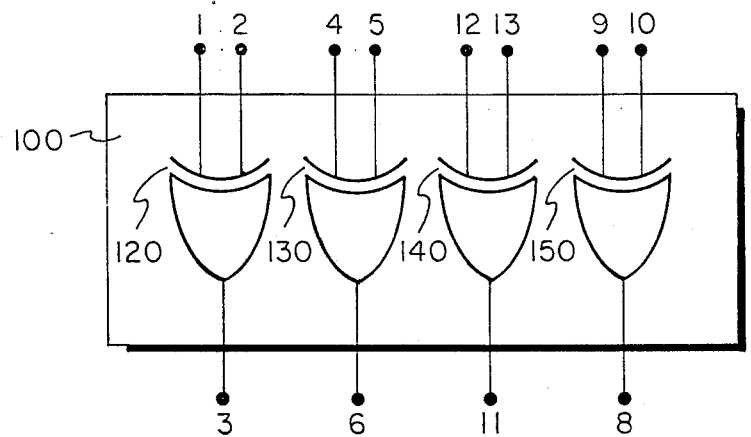
FIG. 1 is a schematic representation of a typical logic quad-pack of exclusive OR logic gates.

Referring to FIG. 1, there shown a quad-pack 100 of exclusive OR logic gates, the gates being identified by reference numerals 120, 130, 140, and 150. Each logic gate has two input terminals and one output terminal, and the terminals are identified in the diagram by reference numerals (which can also be used to designate pin numbers of the quad-pack) as follows: gate 120 has input terminals 1 and 2, and output terminal 3, gate 130 has input terminals 4 and 5, and output terminal 6, gate 140 has input terminals 12 and 13, and output terminal 11, and gate 150 has input terminals 9 and 10, and output terminal 8. The commercially available quad-packs referenced above are also typically provided with power pins (not shown).

Figure 2:
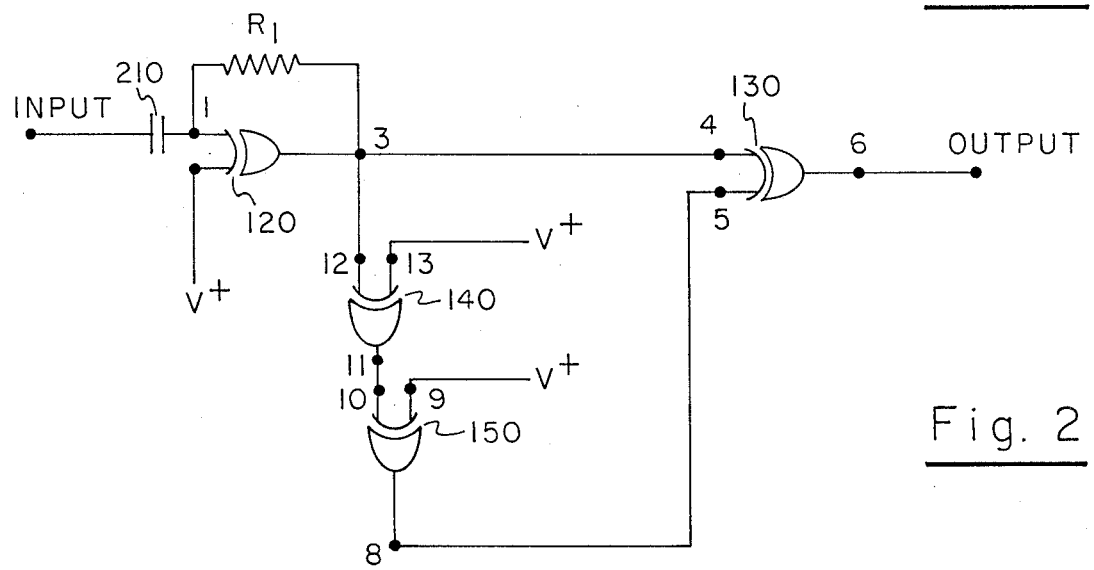
FIG. 2 is a schematic diagram of a circuit made in accordance with an embodiment of the invention.

Referring to FIG. 2, there is shown a circuit produced in accordance with an embodiment of the invention and which utilizes the four logic gates 120, 130, 140 and 150 of the quad-pack 100 of FIG. 1. Like reference numerals in FIG. 2 represent their counterparts of FIG. 1, but with the components being illustrated in a configuration which facilitates explanation of the circuit. An input FM modulated video signal is applied to one of the inputs (terminal or pin 1) of gate 120 via an AC coupling capacitor 210. The other input (pin 2) of gate 120 is coupled to a positive reference potential, V+. A feedback resistor, $R_1$, which may have a value of, for example, 100 K ohms, is coupled between the output (pin 3) and an input (pin 1) of logic gate 120.

The output (pin 3) of logic gate 120 is coupled to one of the inputs (pin 4) of logic gate 130, and also to one of the inputs (pin 12) of logic gate 140. The output of logic gate 140 (pin 11) is coupled to one of the inputs (pin 10) of logic gate 150. The others of the inputs (pins 13 and 9, respectively) of logic gates 140 and 150 are coupled to positive reference potentials, V+. The output (pin 8) of logic gate 150 is coupled to the other input (pin 5) of logic gate 130. The output (pin 6) of logic gate 130 is representative of the detected video output.

In operation, the logic gate 120, configured as shown with a feedback resistor and with its second input coupled to positive reference potential, acts as a limiter; i.e. when the input FM carrier signal exceeds a value which is the supply voltage divided by the gain of the gate, the output will be limited to the predetermined maximum value. The logic gates 140 and 150, configured as shown, pass the limited version of the input signal [i.e., with one input of these gates pegged high, the outputs will substantially track the inputs], but with each having an intrinsic delay of about 7 ns. The total delay of about 14 ns provides a phase shift of appoximately 90° at the typical operating frequency of about 18 MHz (for the FM carrier signal). The logic gate 130 therefore receives the limited FM carrier signal at one input and the same signal, shifted by about 90°, at its other input. As is known in the art, an exclusive OR gate can be utilized in this fashion to frequency detect the video signal that was originally used to FM modulate the carrier.

Figure 3:
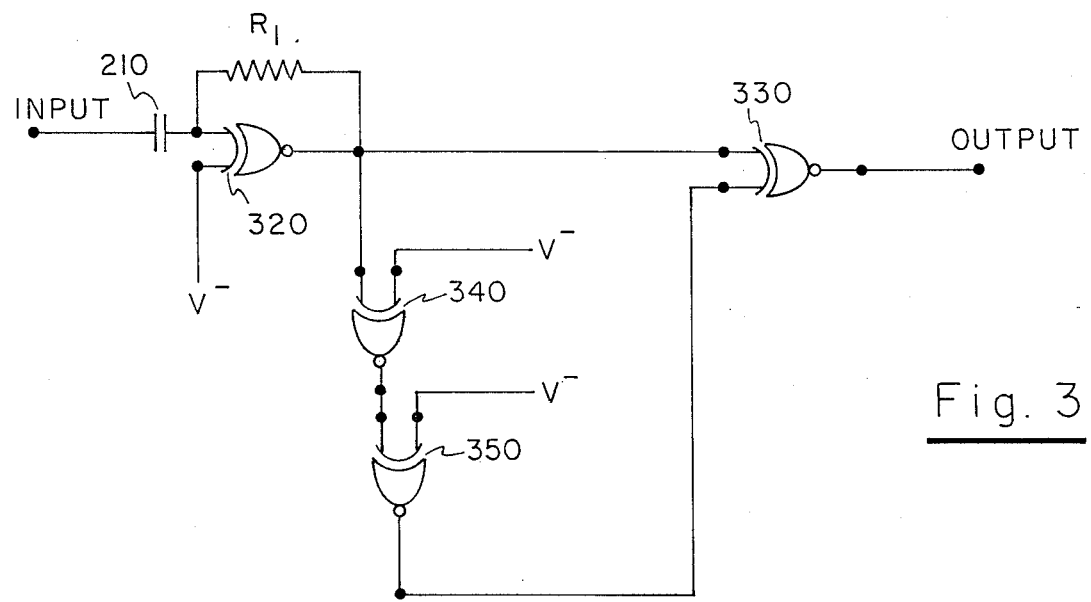
FIG. 3 is a schematic diagram of a circuit made in accordance with another embodiment of the invention.

The invention can be practised in similar manner using a quad-pack of exclusive-NOR logic gates. As seen in FIG. 3, the configuration is generally the same as in FIG. 2, but with exclusive NOR gates 320, 330, 340 and 350 instead of their counterpart exclusive OR gates 120, 130, 140 and 150 of FIGS. 1 and 2. The positive reference potentials V+ of FIG. 2 are replaced by negative reference potentials designated V−.

The invention has been described with reference to particular preferred embodiments, but variations within the spirit and scope of the invention will occur to those skilled in the art. For example, while the same reference potential designation have been used for application to various logic gates, it will be understood that different reference potentials can be employed if desired.

I claim:

1. A method for converting a logic gate pack that includes four exclusive OR or exclusive NOR logic gates, each said logic gate having a pair of input terminals and an output terminal, into a circuit for limiting and detecting an FM input signal, comprising the steps of:
coupling said input signal to one input terminal of a first of said logic gates;
coupling the other input terminal of said first logic gate to a reference potential;
coupling the output terminal of said first logic gate to said one input terminal thereof in a feedback arrangement;
coupling the output terminal of said first logic gate to one input terminal of a second of said logic gates, the other input terminal of said second logic gate being coupled to a reference potential;
coupling the output terminal of said second logic gate to one input terminal of a third of said logic gates, the other of the input terminals of said third logic gate being coupled to a reference potential; and
coupling the output terminal of said third logic gate to one of the input terminals of a fourth of said logic gates, and coupling the other input terminal of said fourth logic gate to the output terminal of said first logic gate;
whereby the signal at the output terminal of said fourth logic gate is representative of a detected version of said FM input signal.

2. The method as defined by claim 1, wherein said FM input signal has an operating frequency of about 18 MHz.

3. The method as defined by claim 1, wherein said logic gates are exclusive OR gates, and said reference potentials are positive reference potentials.

4. The method as defined by claim 1 wherein said logic gates are exclusive NOR gates, and said reference potentials are negative reference potentials.

5. The method as defined by claim 1, wherein said feedback arrangement is implemented via a resistive means.

6. The method as defined by claim 2, wherein said feedback arrangement is implemented via a resistive means.

7. The method as defined by claims 1, wherein said input signal is a video signal.

8. The method as defined by claim 2, wherein said input signal is a video signal.

9. The method as defined by claim 6, wherein said input signal is a video signal.

10. For use in conjunction with a logic gate pack that includes four exclusive OR or exclusive NOR logic gates, each having a pair of input terminals and an output terminal, the improvement comprising a detector circuit for receiving an FM input signal and producing a limited and detected version thereof, comprising:
means for coupling said input signal to one input terminal of a first of said logic gates;
means for coupling the other input terminal of said first logic gate to a reference potential;
means for implementing feedback between the output terminal of said first logic gate and said one input terminal of said first logic gate;
means for coupling a second and a third of said logic gates in series combination, such that said series combination acts as a delay means, which one input terminal of said second logic gate serving as the input of said delay means, the other input terminal of said second logic gate being coupled to a reference potential, the output terminal of said second logic gate being coupled to one input terminal of said third logic gate, the other input terminal of said third logic gate being coupled to a reference potential, and the output terminal of said third logic gate serving as the output of said delay means, the input of said delay means being coupled to the output terminal of said first logic gate;
means for coupling one input terminals of a fourth of said logic gates to the output terminal of said first logic gate; and
means for coupling the output of said delay means to the other input terminal of said fourth logic gate;
the output terminal of said fourth logic gate serving as an output of said detector circuit.

11. Apparatus as defined by claim 10, wherein said FM input signal has an operating frequency of about 18 MHz, and said logic gates have an intrinsic delay of about 7 ns.

12. Apparatus as defined by claim 10, wherein said logic gates comprise exclusive OR gates, and said reference potentials are positive reference potentials.

13. Apparatus as defined by claim 10, wherein said logic gates comprise exclusive NOR gates, and said reference potentials are negative reference potentials.

14. Apparatus as defined by claim 10, wherein said means for implementing feedback between the output terminal and said one input terminal of said first logic gate comprises coupling a resistive means therebetween.

15. Apparatus as defined by claim 11, wherein said means for implementing feedback between the output terminal and said one input terminal of said first logic gate comprises coupling a resistive means therebetween.

16. Apparatus as defined by claim 10, wherein said input signal is a video signal.

17. Apparatus as defined by claim 11, wherein said input signal is a video signal.

18. Apparatus as defined by claim 15, wherein said input signal is a video signal.

* * * * *